(12) United States Patent
Erlich et al.

(10) Patent No.: US 7,376,117 B2
(45) Date of Patent: May 20, 2008

(54) INTERLEAVING CIRCUIT FOR A MULTIBAND OFDM TRANSCEIVER

(75) Inventors: Yossi Erlich, Hod Hasharon (IL); Assaf Gurevitz, Tel Aviv (IL)

(73) Assignee: Infineon Technologies AG, Munich (DE)

( * ) Notice: Subject to any disclaimer, the term of this patent is extended or adjusted under 35 U.S.C. 154(b) by 505 days.

(21) Appl. No.: 10/987,191

(22) Filed: Nov. 12, 2004

(65) Prior Publication Data
US 2005/0152327 A1 Jul. 14, 2005

Related U.S. Application Data

(60) Provisional application No. 60/526,181, filed on Dec. 2, 2003.

(51) Int. Cl.
*H04J 1/00* (2006.01)
(52) U.S. Cl. ...................... 370/343; 370/206; 370/208; 370/338; 370/319; 370/348; 435/422; 435/450; 435/17; 435/102; 435/103; 435/104; 375/130; 375/146; 375/279
(58) Field of Classification Search ............... 370/338, 370/343, 206, 208, 348, 319; 455/422, 450, 455/17, 102, 103, 104; 375/130, 146–147, 375/279
See application file for complete search history.

(56) References Cited

U.S. PATENT DOCUMENTS 6,108,369 A * 8/2000 Ovesjo et al. ............... 375/146

2004/0178934 A1 * 9/2004 Balakrishnan et al. ........ 341/80
2004/0218683 A1 * 11/2004 Batra et al. .................. 375/261
2004/0228269 A1 * 11/2004 Balakrishnan et al. ...... 370/208
2005/0078598 A1 * 4/2005 Batra et al. .................. 370/206

FOREIGN PATENT DOCUMENTS

EP 1 170 917 A1 1/2002

OTHER PUBLICATIONS

Batra et al. "Multi-band OFDM physical Layer Proposal for IEEE 802.15 Task Group 3a." *IEEE P802.15 Wireless Personal Area Networks*. Jun. 2007, pp. 1-69.

* cited by examiner

*Primary Examiner*—Steve M. D'Agosta
(74) *Attorney, Agent, or Firm*—Maginot, Moore & Beck

(57) ABSTRACT

Interleaving circuit for a multiband OFDM (orthogonal frequency division multiplexing) transceiver of a ultra wide band wireless personal access network transmitting OFDM modulated symbols, wherein each OFDM symbol consists of a predetermined number ($N_{CBPS}$) of encoded bits,
said interleaving circuit comprising
a symbol interleaving unit which receives an input bitstream of encoded bits and permutes adjacent bits of said input bitstream across different OFDM symbols;
an intra-symbol tone interleaving unit which receives the bits permuted by said symbol interleaving unit and permutes adjacent bits of each OFDM symbol across uncorrelated data sub-carriers; and
an intra-symbol cyclic shift unit which shifts cyclically $N_{CBPS}$ bits of each OFDM symbol in response to a shift value (K) which is changed between adjacent OFDM symbols.

16 Claims, 10 Drawing Sheets

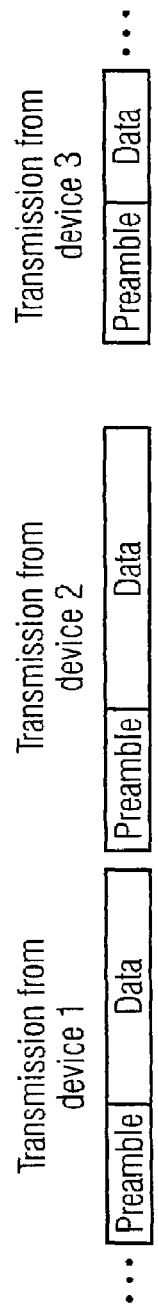
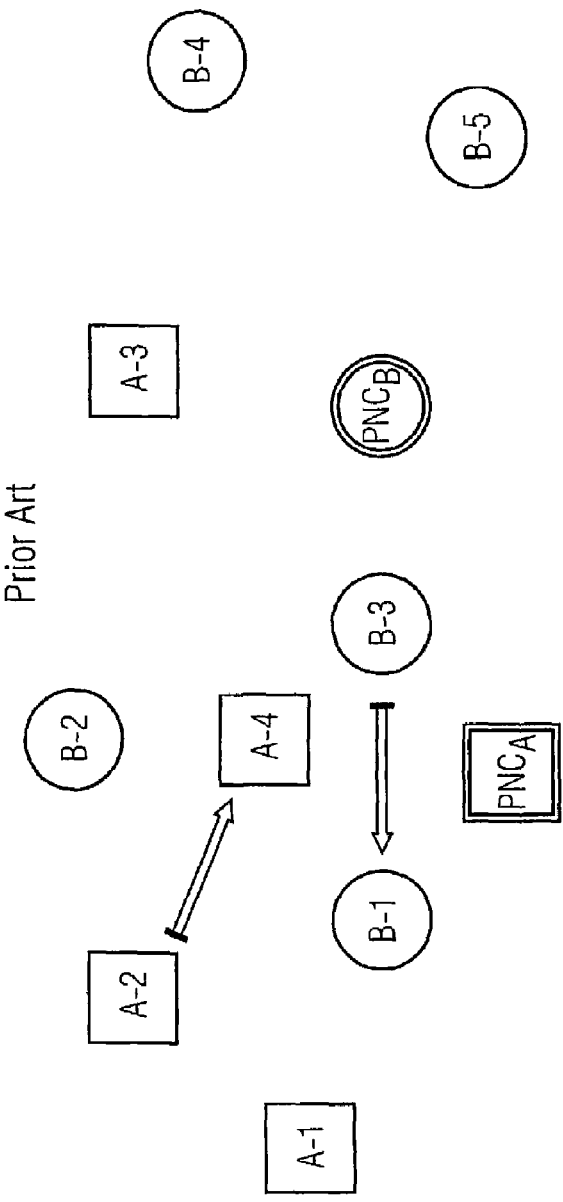
FIG 1
Prior Art
FIG 2
Prior Art pattern 6-symbols/line

INTERLEAVING CIRCUIT FOR A MULTIBAND OFDM TRANSCEIVER

This application claims the benefit of U.S. Provisional Patent Application Ser. No. 60/526,181, filed Dec. 2, 2003, and which is incorporated herein by reference.

FIELD OF THE INVENTION

The present invention relates to an interleaving circuit for a multiband OFDM transceiver of an ultra wide band wireless personal access network.

BACKGROUND

FIG. 1 shows the transmission of data in a wireless system according to the state of the art. Several transceivers belonging to the same wireless local area network (WLAN) use the same data transmission channel by means of time sharing. At any specific time only one transceiver is transmitting. Accordingly the transmissions from each transceiver are burst like. For helping the receiving transceiver to identify a data transmission burst and for extracting the delivered information data the transmitting transceiver sends a predefined preamble signal preceding the data portion of the data transmission burst. The transceiver that receives the data transmission burst comprises a preamble detection unit that identifies the preamble and thus identifies the data transmission burst. The transceiver uses further the preamble for estimating data transmission and channel parameters such as channel response and carrier and timing offsets that are needed for the data information extraction.

Commonly several communication networks share the same data transmission media. Specifically collocated wireless networks utilize the same frequency spectrum.

FIG. 2 shows two collocated wireless networks according to the state of the art.

Wireless local areas networks (WLAN) represent a new form of communications among personal computers or other devices that wish to deliver digital data. A wireless network is one that does not rely on cable as the communications medium. Whether twisted pair, coax, or optical fibers, hard wiring for data communication systems within a building environment is expensive and troublesome to install, maintain and to change. To avoid these disadvantages wireless networks transmit data over the air using signals that cover a broad frequency range from few MHz to a few terahertz. Depending on the frequency involved wireless networks comprise radio wireless networks, microwave wireless networks and infrared wireless networks.

Wireless networks are used mainly for connecting devices within a building or connecting portable or mobile devices to a network. Further applications are keeping mobile devices in contact with a data base and ad hoc networks for example in committee or business meetings.

Wireless local area networks (WLAN) and wireless personal area networks (WPAN) are used to convey information over relatively short ranges. A wireless personal area network (WPAN) is defined in the IEEE 802.15.3 standard.

In many situations and scenarios several wireless local area networks (WLANs) are operated simultaneously with each other in the same local area. A typical situation would be a big office wherein many office cubicles are located belonging to different divisions of the same company, e.g. search division, accounting division, marketing division. The computers of each division are connected in such a situation by means of separate wireless local area networks (WLANs). A wireless local area network (WLAN) comprising several transceivers is referred to as a Piconet.

FIG. 2 shows typical scenario where two wireless local area networks (WLANs) are operated in the same local area.

In the shown example a first transmitting transceiver A2 transmits data to a receiving transceiver A4 of the first wireless local area network WLANA on the data transmission channel of the wireless local area network WLANA. Further a transmitting transceiver B3 of the second wireless local area network WLANB transmits data to a receiving transceiver B1 of the same wireless local network WLANB on the data transmission channel of this wireless local area network. The data exchange between transceivers is performed half duplex, i.e. a transceiver can either send or receive data over a data link to another transceiver of the same wireless local area network. The data are exchanged via data packets.

Each Piconet WLANi has its respective data transmission channel, i.e. the data transmission channel is used by all transceivers of the corresponding Piconet WLANi.

In most cases the frequency resources available for a wireless local area network WLAN are bounded by regulations. Usually a certain frequency band is allocated for the wireless local networks. Within this frequency band each transceiver is required to radiate no more than a specified average power spectral density (PSD).

To operate several wireless local area networks simultaneously several proposals have been made.

In frequency division multiplexing (FDM) systems according to the state of the art the allocated frequency band is divided into several sub-frequency bands. In FDM-system each data transmission channel and consequently each Piconet is using a different frequency sub-band. Thus, data transmission in different Piconets (WLANs) can simultaneously be performed without interference.

The disadvantage of FDM-systems is that the available capacity for each Piconet is reduced compared to the case where any Piconet is allowed to use the entire allocated frequency band.

The channel capacity is given by the following formula:

$$cap = \int \log\left(1 + \frac{PSD(f)}{N(f)}\right) df$$

The capacity of each Piconet is larger if it will be allowed to use the full frequency band instead of just the allocated frequency sub-band The reduction in the capacity in FDM-systems translates directly to throughput reduction. Consequently the achievable data bit rate for any specific transmitter-receiver distance is reduced in FDM-systems.

In a CDMA-DSSS (Code Division Multiple Access—Direct Sequence Spread Spectrum) system according to the state of the art a direct sequence spread spectrum is used as a modulation scheme. In DSSS a sequence of many short data symbols is transmitted for each information symbol. In order to support several data transmission channels or Piconets different data sequences with low cross correlation between them are used for different data transmission channels.

In a CDMA-DSSS-system each channel can use the entire frequency band until the maximum possible throughput can be achieved. If some Piconets are working in the same area then the transmission of one Piconet is seen as additional noise by the other Piconets.

The disadvantage of the CDMA-DSSS-System is that there exists a so called near-far problem. When a transceiver in one Piconet is transmitting this transmission will be seen as additional noise by other Piconets. The level of the additional noise is proportional to the cross correlation between the spreading sequences and the received power level of the interferer's signal. For example if the interfering transceiver of Piconet A is close to a receiving transceiver of Piconet B, i.e. closer than a transmitting receiver of Piconet B then the added noise level that the receiving transceiver of Piconet B sees causes a significant reduction in the achievable bit rate for the receiver, so that even a complete blocking of the data transmission channel can occur.

A further proposal according to the state of the art to operate several wireless local area networks (WLANs) simultaneously is to use a CDMA-PH(Code Division Multiple Access—Frequency Hopping)—System. In this CDMA-PH-System the original frequency band is divided into several sub-frequency bands. Any transmitting transceiver uses a certain frequency sub-band for a certain time interval and moves then to the next frequency band. A predefined frequency hopping sequence controls the order of sub-frequency bands such that both the transmitting and receiving transceiver has the information when to switch to the next frequency and to what sub-frequency band.

In a conventional CDMA-PH-System the different data transmission channels are assigned with different frequency hopping sequences.

FIG. 3A shows a CDMA-PH-System according to the state of the art with data transmission channels. A CDMA-PH-System with four data transmission channels can operate four Piconets or wireless local area networks (WLANs) simultaneously at the same local area. In the shown example any transceiver uses a certain frequency band for a transmission interval for 242 ns, remains idle for a predetermined guard time of 70 ns and uses the next frequency band within the next transmission interval etc.

The frequency hopping sequence is fixed for any data transmission channel A, B, C, D. In the given example data transmission channel A has the frequency hopping sequence abc, channel B has the frequency hopping sequence acb, channel C has the frequency hopping sequence aabbcc and channel D has the frequency hopping sequence aaccbb.

A collision is a situation when two transceivers use the same frequency band at the same time. For example a collision between data transmission channel A and data transmission channel B occurs during the first transmission interval when both channels A, B use frequency fa and during the fourth transmission interval when both channels A, B use again frequency fa. A further collision is for example between channel B and channel D during the first transmission interval when both channels B, D use frequency a and the sixth transmission interval when both channels B, D use frequency fb.

When the frequency hopping order of two wireless networks differs two transceivers that belong to different wireless local area networks can transmit at the same time. It may happen that both transceivers use the same carrier frequency at the same time.

One possible CDMA-FH solution is based on OFDM and is called Multiband OFDM. In this case the transceiver transmits a single OFDM in one band and then hops to the next band for transmitting the next OFDM symbol. FIG. 3A depicts 6 OFDM symbols for each channel.

As shown in FIG. 3A the Multiband OFDM Transceiver performs in a time frequency interleaving (TFI) mode bandhopping wherein in each frequency band an OFDM symbol is transmitted. The band-hopping sequence is defined by a TFC code (Time frequency code) stored in a memory. Different collocated networks use different TFC codes. This enables simultaneous transmission of different networks OFDM symbols from collocated networks collide. In common scenarios the collision level enables efficient communication. Yet in some cases the collisions situation is severe and the communication is not efficient. To overcome severe collisions between transmission of different networks frequency domain separation (known as FDM) between the wireless networks can be implemented. This is achieved by adding TFC codes with constant band usage (fixed frequency bands). Accordingly a Multiband OFDM Transceiver according to the state of the art is switchable between a time frequency interleaving mode (TFI mode) and a fixed frequency interleaving mode (FFI mode). FIG. 3B shows 7 channels (7 TFC) where 4 channels are of TFI type and 3 channels are of FFI type.

As can be seen in FIG. 3B the transceiver occupies in the TFI mode three frequency bands, wherein each frequency band has a predetermined frequency bandwidth.

According to the evolving multiband OFDM standard the period of one OFDM symbol is 312.5 nSec, i.e. a data length of 242.5 nSec (128 samples at 528 Msps) and a silence time of 70 nSec (37 samples at 528 Msps) between two transmissions. Consequently the OFDM symbol rate RS=3.2 MHz=1/312.5 nSec. When using three frequency bands there are seven possible time frequency codes (TFC). The first four TFC codes define the frequency band hopping sequence when the transceiver is in the TFI mode. When the transceiver is switched to the FFI mode the transceiver transmits the signal in a fixed frequency band. As shown in the following table and in FIG. 3B, the fifth TFC code indicates that transceiver transmits a signal in a first frequency band, the sixth TFC code indicates that the transceiver transmits the signal in a second frequency band and the seventh TFC code indicates that the transceiver transmits a signal in a third frequency band.

The following TFC code have three frequency bands as summarized in the following table:

TABLE 1

| TFC Index | Code | Type |
| --- | --- | --- |
| 1 | [1, 2, 3] | TFI |
| 2 | [1, 3, 2] | TFI |
| 3 | [1, 1, 2, 2, 3, 3] | TFI |
| 4 | [1, 1, 3, 3, 2, 2] | TFI |
| 5 | [1] | FFI |
| 6 | [2] | FFI |
| 7 | [3] | FFI |

TFC indices 1-7 in the table corresponds to channels A-G in FIG. 3b.

A single burst of transmission is called a PLCP frame. FIG. 4 shows the data format of a PLPC frame used by a multiband OFDM transceiver. Each frame consists of a preamble, a header and a payload data section. The PLPC header is transmitted with a constant data rate of 39.4 Mbit per second whereas the payload data is transmitted with different data rates varying between 53.3 Mbit per seconds and 480 Mbit per second depending on the selected operation mode of the OFDM transceiver. The PLCP frame as shown in FIG. 4 consists of a plurality of OFDM symbols, wherein each OFDM symbol consists of a predetermined number ($N_{CBPS}$) of encoded data bits. Each OFDM symbol comprises for instance 100 or 200 encoded data bits depending on the selected data rate. As can be seen from FIG. 3B each OFDM symbol is transmitted within different frequency bands $f_a$, $f_b$, $f_c$ according to a predetermined frequency hopping pattern. For example three frequency bands $f_a$, $f_b$, $f_c$, are employed by the OFDM transceiver so that seven different frequency hopping patterns are possible as shown in FIG. 3B via a corresponding number of data transmission channels A, B, C, D, E, F, G. Each frequency band $f_a$, $f_b$, $f_c$ employed by the OFDM transceiver comprises a center frequency around which a predetermined number of sub-carriers or tones are provided. A frequency comprises for instance 122 sub-carriers consisting of pilot sub-carriers, guard sub-carriers and data sub-carriers. Each sub-carrier is equidistant to its neighboring sub-carrier and can be modulated separately.

For increasing the performance of the data transmission interleaving is employed by an OFDM transceiver.

In a conventional OFDM transceiver according to the state of the art the encoded bitstream is interleaved prior to modulation by a bit interleaving circuit comprising two stages. The conventional bit interleaving unit comprises a symbol interleaving unit and a tone interleaving unit.

The symbol interleaving unit permutes the bits of the received bitstream across different OFDM symbols to exploit frequency diversity across the sub-frequency bands $f_a$, $f_b$, $f_c$. The tone interleaving stage of the bit interleaving circuit according to the state of the art permutes the bits received by the symbol interleaving stage across different data tones (data sub-carriers) within an OFDM symbol to exploit frequency diversity across tones so that more robustness against narrow band interference signals and against frequency-selective channels is provided.

However, the bit interleaving circuit according to the state of the art as employed in a conventional multiband OFDM transceiver has several disadvantages.

In some cases there exists a correlation between the qualities of tones, i.e. sub-carriers, from two different OFDM symbols which have the same index within the OFDM sequence.

A first case where such a correlation exists is when, as in the FFI mode, i.e. channel E, F, G as shown in FIG. 3b, and TFC index 5, 6, 7, and the table above, no frequency band hopping is performed.

A second case is as in channel C, D shown in FIG. 3b where two adjacent OFDM symbols might be transmitted in the same frequency band. For instance the first two OFDM symbols are transmitted in a frequency band $f_a$ as shown in FIG. 3B. The next two OFDM symbols are transmitted in the frequency $f_b$ as shown in FIG. 3B. The quality of sub-carriers or tones within such a frequency band are correlated to each other so that the quality of interleaving is degraded.

Even in a TFI mode where the frequency band is changed with each OFDM symbol such as in channel A, channel B shown in FIG. 3B there might be a correlation between different tones within one OFDM symbol because the same tones or sub-carriers within one frequency band can be degraded in the baseband in a similar manner. The OFDM symbol is transmitted within a frequency band which comprises for example 122 sub-carriers. The tones or sub-carriers which are located at the edges of the frequency band may suffer more from imperfect filtering than tones which are located closer to a center frequency of said frequency band. The sub-carriers or tones which are located at the edges of the frequency band might even be cut off by misadjusted filters within the baseband transmission. Another possibility is when zero-IF conversion is used so that the DC offset effects the near-DC tones within the frequency band.

Since conventional interleaving with a bit interleaver circuit according to the state of the art is not optimal in all the above mentioned cases the performance of the data transmission of an OFDM transceiver which employs a conventional bit interleaving circuit having only a symbol interleaving stage and a tone interleaving stage is degraded.

SUMMARY

Accordingly it is the object of the present to provide an interleaving circuit for a multiband OFDM transceiver and a corresponding method which improves the performance of the data transmission.

This object is achieved by an interleaving circuit having the features of main claim 1.

The invention provides an interleaving circuit for a multi-band OFDM (orthogonal frequency division multiplexing) transceiver of a ultra wide band wireless personal access network transmitting OFDM modulated symbols, wherein each OFDM symbol consists of a predetermined number ($N_{CBPS}$) of encoded bits, said interleaving circuit comprising:

(a) a symbol interleaving unit which receives an input bitstream of encoded bits and permutes adjacent bits of said input bitstream across different OFDM symbols;

(b) an intra-symbol tone interleaving unit which receives the bits permuted by said symbol interleaving unit and permutes adjacent bits of each OFDM symbol across uncorrelated data tone sub-carriers;

and (c) an intra-symbol cyclic shift unit which shifts cyclically $N_{CBPS}$ bits of each OFDM symbol in response to a shift value (K) which is changed between adjacent OFDM symbols.

In a preferred embodiment each interleaved OFDM symbol is forwarded by said interleaving circuit to a frequency spreading unit which depending on an operation mode of said OFDM transceiver spreads the OFDM symbols in the frequency domain with an adjustable frequency spreading factor (FSF).

In a preferred embodiment the frequency spreading unit is connected to an OFDM modulator which modulates each sub-carrier of the frequency band depending on an operation mode of said OFDM transceiver either with DCM modulation (Dual Carrier Modulation) or with QPSK modulation.

In a preferred embodiment the OFDM modulator is connected to a time spreading unit which depending on an operation mode of said OFDM transceiver spreads the OFDM symbols in the time domain with an adjustable time spreading factor (TSF).

In a preferred embodiment the time spreading unit is connected to a transmitter which transmits each interleaved OFDM symbol in different frequency bands (fa, fb, fc) according to a predetermined frequency hopping pattern comprising a corresponding pattern periodicity P.

In a preferred embodiment the number of frequency bands employed by the OFDM transceiver is three.

In a preferred embodiment the least common multiple of the set of frequency hopping pattern periodicities ($P_{max}$) is six In a preferred embodiment each frequency band comprises a center frequency and a predetermined number of sub-carriers.

The sub-carriers of each frequency band comprises in a preferred embodiment pilot sub-carriers, guard sub-carriers and data sub-carriers.

In a preferred embodiment a number of sub-carriers within each frequency band is 122.

In a preferred embodiment the number of data tone sub-carriers within each frequency band is 100.

In a preferred embodiment the input-output relationship between the output bits S(i) output by the symbol interleaving unit and the input bits U(i) applied to the symbol interleaving unit is given by $$S(i)=U\{\text{Floor}(i/N_{CBPS})+M\,\text{Mod}(i,\,N_{CBPS})\} \quad (1)$$

wherein $M=P_{max}/TSF$

In a preferred embodiment the input-output relationship between the output bits T(i) output by said tone interleaving unit and the input bits S(i) applied to the tone interleaving unit is given by:

$$T(i)=S\{\text{Floor}(i,N_{TINT})+10\text{Mod}(i,\,N_{TINT})\} \quad (2)$$

wherein $N_{TINT}=N_{CBPS}/10$

In a preferred embodiment the input-output relationship between the output bits V(i) output by said cyclic shift unit and the input bits T(i) applied to the cyclic shift unit is given by:

$$V(i)=T\{b,\,\text{Mod}(i+k(b),\,N_{CBPS})\} \quad (3)$$

wherein K is a shift value depending from a OFDM symbol index b, defined by:

$$b=\text{Mod}\{\text{floor}(i/N_{CBPS}),\,M\}$$

In a preferred embodiment the shift value K employed by the cyclic shift unit of the interleaving circuit according to the present invention is given by:

$$k(b)=b\cdot\text{round}(N_{CBPS}/M) \quad (4)$$

wherein
b is the OFDM symbol index
b=0, 1, 2, ..., M−1
and
$M=P_{max}/TSF$ wherein $P_{max}$, is the least common multiple of the set of frequency hopping pattern periodicities and TSF is the time spreading factor employed by the time spreading unit.

In the following preferred embodiments of the interleaving circuit for a multiband OFDM transceiver according to the present invention is described with reference to the enclosed figures.

BRIEF DESCRIPTION OF THE DRAWINGS

FIG. 1 shows the data transmission wireless system according to the state of the art;

FIG. 2 shows two collocated wireless networks according to the state of the art;

DETAILED DESCRIPTION

Figure 5:
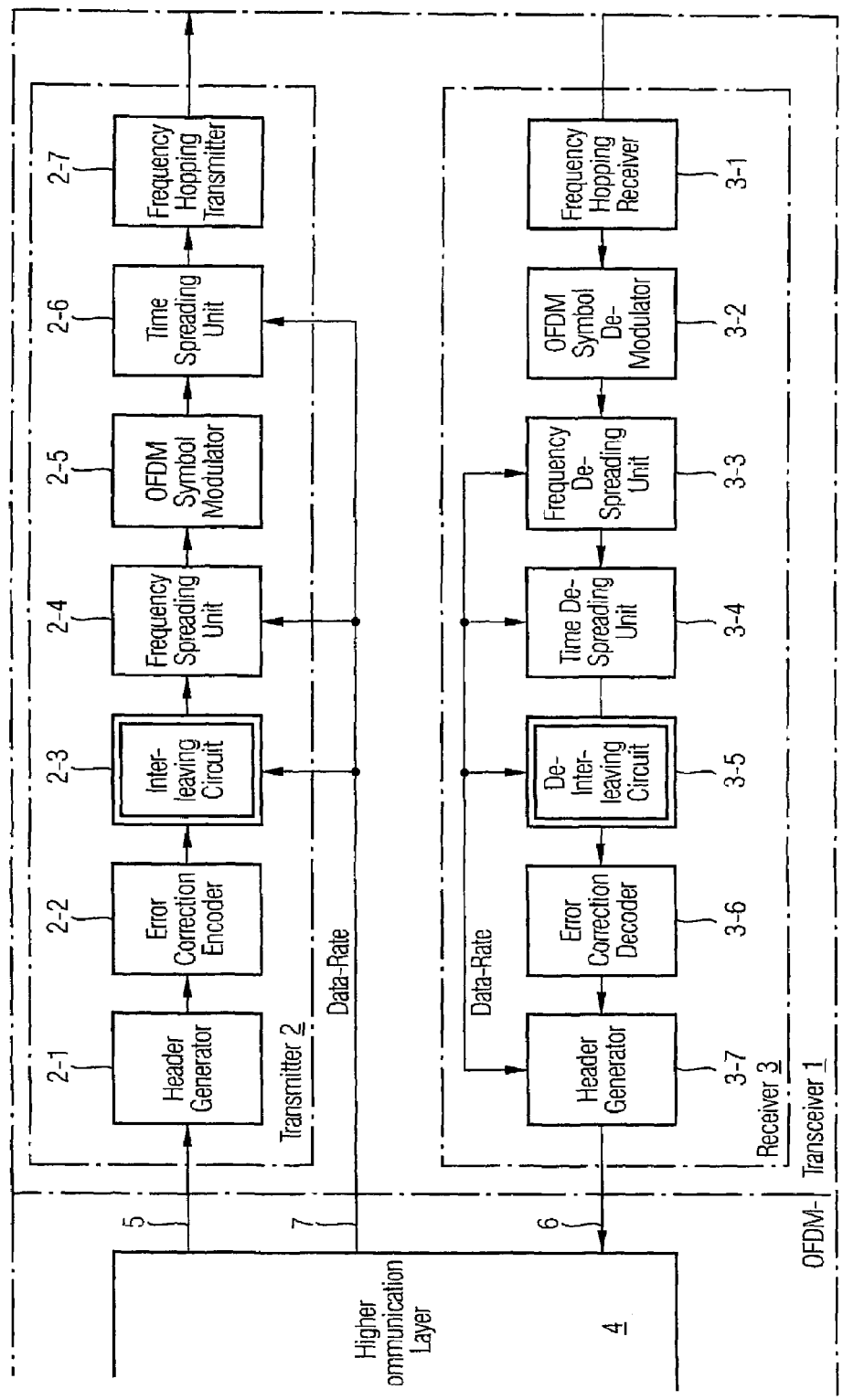
FIG. 5 shows a block diagram of a transceiver which comprises an interleaving circuit according to the present invention.

As can be seen from FIG. 5 an OFDM transceiver 1 comprises a transmitter 2 and a transceiver 3 which are both connected to a higher communication layer block 4.

The higher communication layer circuit 9 applies a bit-stream via a line 5 to a transmitter 2 and receives a bitstream via a line 6 from the receiver 3. The bitstream coming from the higher communication layer is received by a header generator 2-1 within the transmitter 2 which adds a PHY header to the information payload. Within the PHY header the data rate is preset. The header generator 2-1 is connected to an error correction encoder 2-2 which encodes the received data stream. All data bits are encoded by the error correction encoder by means of a convolutional code. Additionally the PLCP header of the PLCP frame is encoded using a Reed Solomon code. The error correction encoder 2-2 is connected on its output side to an interleaving circuit 2-3 according to the present invention.

Figure 6:
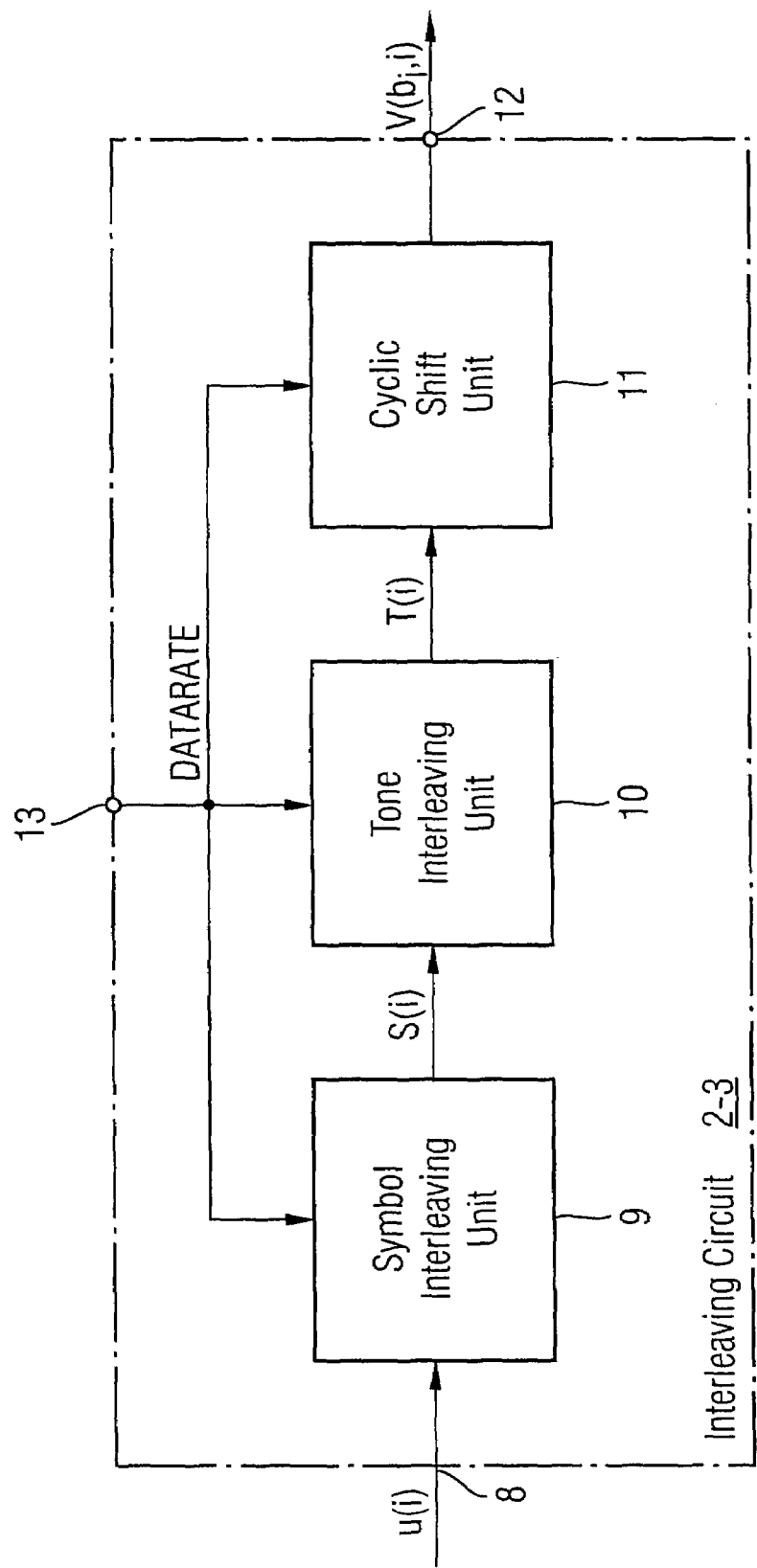
FIG. 6 shows a block diagram of an interleaving circuit according to the present invention.

The interleaving circuit 2-3 according to the present invention is shown as a block diagram in FIG. 6. The bit interleaving circuit 2-3 interleaves the received bitstream to increase the performance of the data transmission wherein the interleaved bitstream is applied to a frequency spreading unit 2-4 within the transmitter 2. The frequency spreading unit 2-4 spreads the received bits in the frequency domain with a frequency spreading factor FSF which is set according to the data rate.

The frequency spreading unit 2-4 is connected to an OFDM symbol modulator 2-5 within the transmitter 3 which performs QPSK modulation or a DCM modulation to each sub-carrier of the frequency band depending on the data rate.

The output of the OFDM symbol modulator 2-5 is connected to a time spreading unit 2-6 of the transmitter 2 which spreads the OFDM symbols in the time domain with a time spreading factor (TSF) depending on the data rate.

Figure 3A:
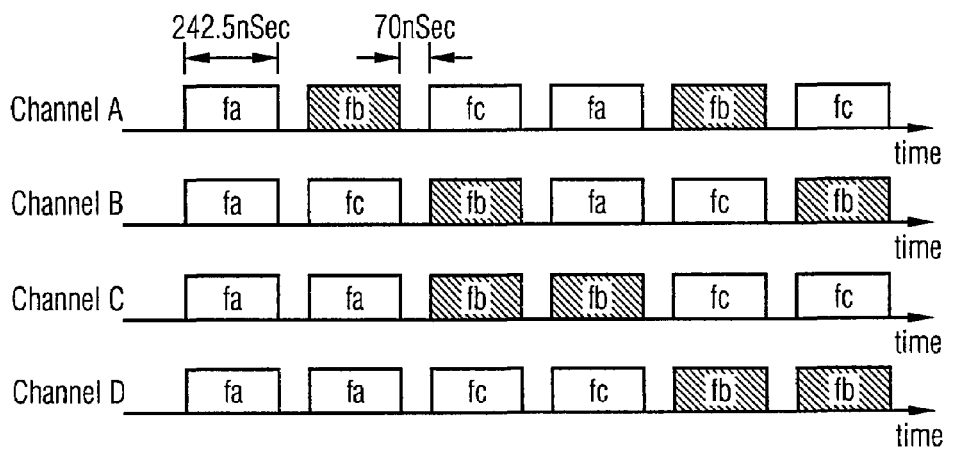
FIG. 3a shows a TFI frequency hopping pattern of an OFDM transceiver according to the state of the art.
Figure 3B:
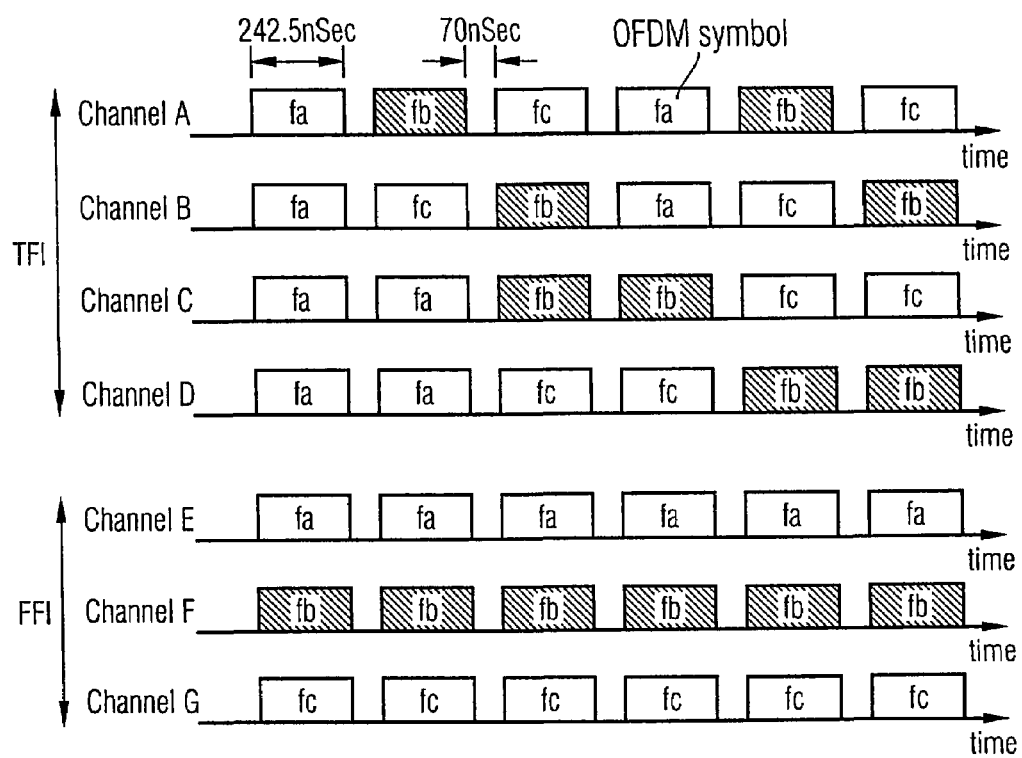
FIG. 3b shows a frequency hopping pattern of an OFDM transceiver according to the state of the art comprising a TFI mode and an FFI mode.
Figure 4:
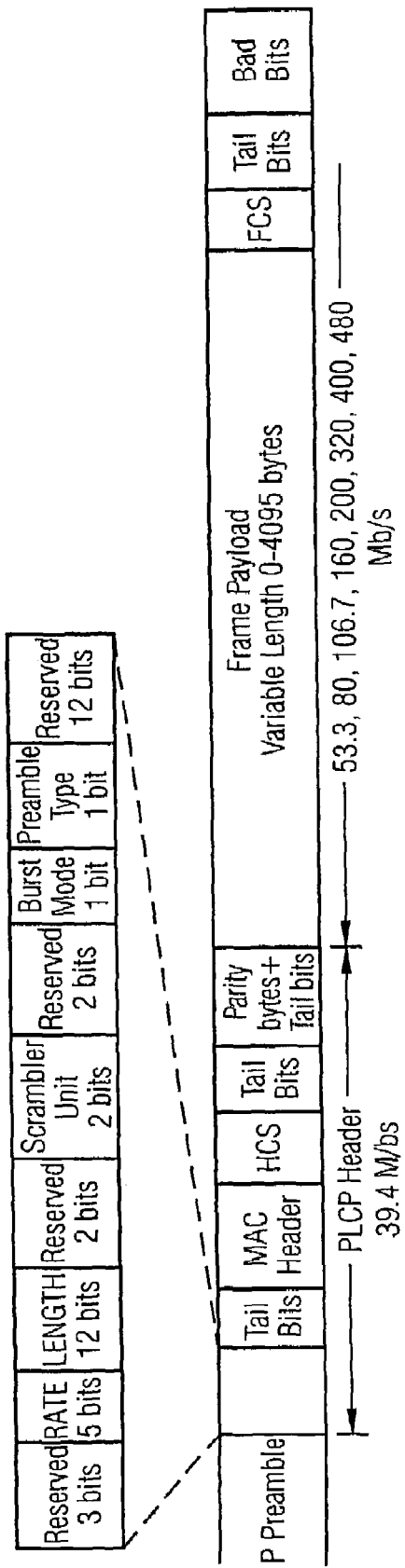
FIG. 4 shows the data structure of the PLCP frame as employed by a conventional OFDM transceiver.

The data stream is forwarded to a frequency hopping transmitter 2-7 of the transmitter 2 which transmits each interleaved and spread OFDM symbol in a different or the same frequency band $f_a$, $f_b$, $f_c$, according to a predetermined frequency hopping pattern comprising a corresponding pattern periodicity P as shown in FIG. 3b. The frequency hopping pattern is determined by the selected data transmission channel of the OFDM transceiver 1.

The OFDM transceiver 1 further comprises a receiver 3 which is symmetrically built to the transmitter 2. Accordingly the receiver 3 comprises a frequency hopping receiver 2-1, an OFDM symbol demodulator 3-2, a frequency despreading unit 3-3, a time despreading unit 3-4, a deinterleaving circuit 3-5, an error correction decoder 3-6 and an header extractor 3-7 as shown in FIG. 5.

Figure 10:
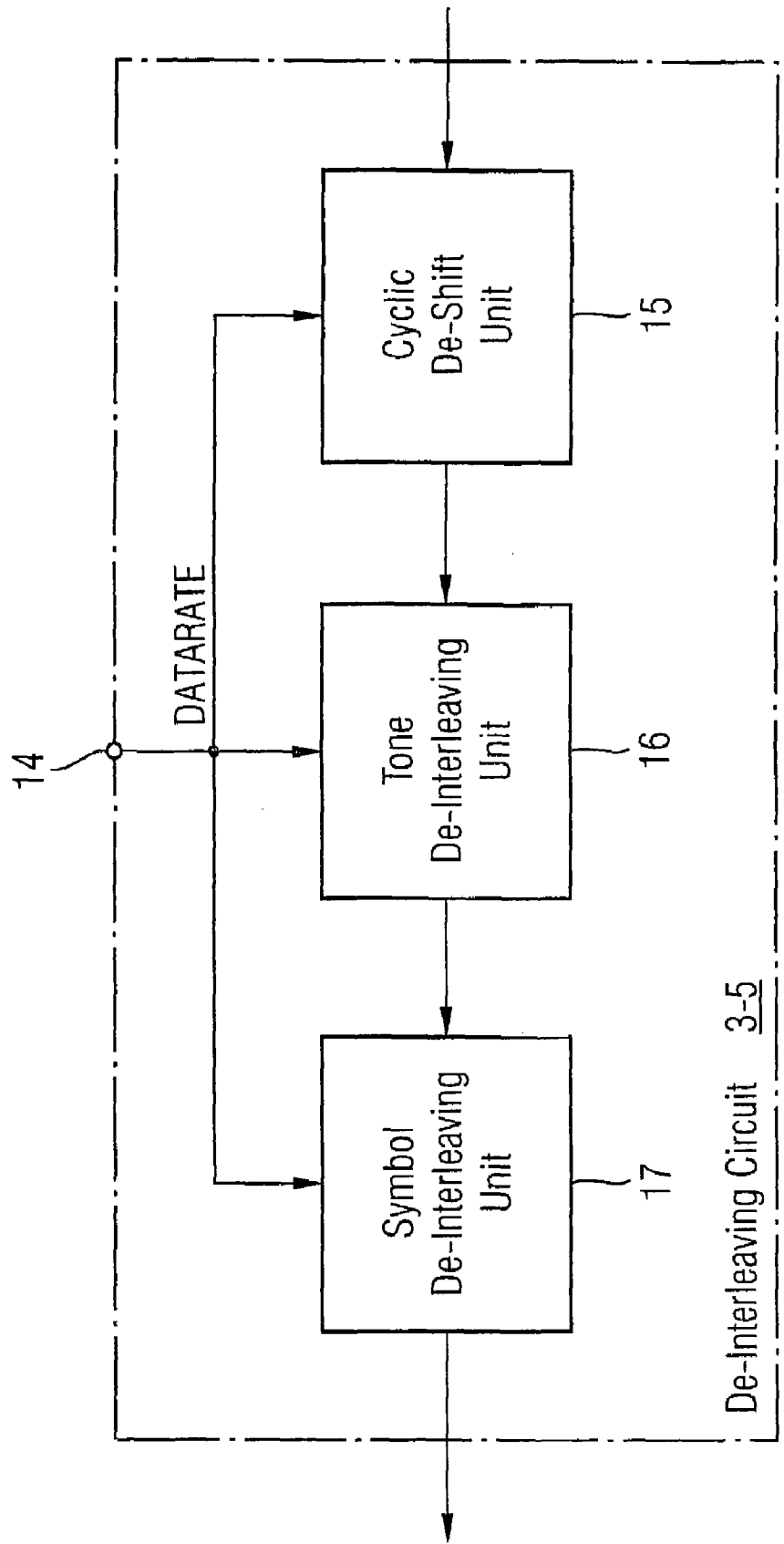
FIG. 10 shows a block diagram of a deinterleaving circuit as employed within an OFDM transceiver according to the present invention.

A De-Interleaving circuit 3-5 is shown as a block diagram in FIG. 10. The error correction decoder 3-6 is in a preferred embodiment a Viterbi decoder where within the PLCP header section the Viterbi decoder is followed by a Reed Solomon decoder. In the receiver 3 the performance of the Viterbi based decoder 3-6 of the error correction layer depends on the quality-correlation between adjacent bits of the received stream. For example if the sequence of coded bits has a low signal-to-noise-ratio SNR it is likely to end up in a decoding failure. To avoid this the bit interleaving circuit 2-3 of the transmitting transceiver interleaves the encoded bitstream before it is forwarded to the OFDM symbol modulator 2-5. An opposite deinterleaving operation is performed by the deinterleaving circuit 3-5 of the receiving transceiver before the datastream is input to the error correction decoder, i.e. the Viterbi decoder 3-6.

For interleaving the PLCP header the data rate is preset. In contrast when interleaving the payload data bits the data rate is not constant and the interleaving circuit 2-3 receives a data rate control signal via a control line 7 from the higher communication layer block 4.

FIG. 6 shows a block diagram of the interleaving circuit 2-3 according to the present invention.

The interleaving circuit 2-3 comprises a data input 8 to which the encoded bits are applied. The interleaving circuit 2-3 according to the present invention comprises three interleaving stages, i.e. a symbol interleaving unit 9, a tone interleaving unit 10 and a cyclic shift unit 11 which are connected in series. The output of the cyclic shift unit 11 forms the data output 12 of the interleaving circuit 2-3. Via a control input 13 the interleaving circuit 2-3 receives the selected date rate from the higher communication layer block 4 necessary for interleaving the payload data.

Parameters of the OFDM symbol modulator 2-5, the frequency spreading unit 2-4 and the time spreading unit 2-6 are adjusted depending on the data rate as well.

The following table shows the data rate dependent parameters for the transmitter 2 wherein the first row represents a transmission of the header within the PLCP frame with a data rate of 39.4 Mbits per second. In this case QPSK modulation is applied, The frequency spreading factor FSF in the frequency domain applied by the frequency spreading unit 2-4 is two when a conjugate symmetric input is supplied to the IFFT. The time spreading factor TSF applied by the time spreading unit 2-6 is also two.

The remaining eight rows in the following table show parameters for eight different modes each having a different data rate ranging from 53.3 Mbit per second to 480 Mbit per second. Depending on the selected mode 100 or 200 encoded bits are provided for each OFDM symbol. The overall spreading gain is given by the product of the frequency spreading factor (FSF) and the time spreading factor (TSF).

TABLE 2

| Mode | Date Rate (Mb/s) | Modulation | Coding rate (R) | Conjugate Symmetric Input to IFFT | Time Spreading Factor (TSF) | Overall Spreading Gain | Coded bits per OFDM symbol ($N_{CBPS}$) |
|---|---|---|---|---|---|---|---|
| 1 | 39.4 | QPSK | 17/69 (CC + RS) | Yes | 2 | 4 | 100 |
| 2 | 53.3 | QPSK | 1/3 | Yes | 2 | 4 | 100 |
| 3 | 80 | QPSK | 1/2 | Yes | 2 | 4 | 100 |
| 4 | 106.7 | QPSK | 1/3 | No | 2 | 2 | 200 |
| 5 | 160 | QPSK | 1/2 | No | 2 | 2 | 200 |
| 6 | 200 | QPSK | 5/8 | No | 2 | 2 | 200 |
| 7 | 320 | DCM | 1/2 | No | 1 (No Spreading) | 1 | 200 |
| 8 | 400 | DCM | 5/8 | No | 1 (No Spreading) | 1 | 200 |
| 9 | 480 | DCM | 3/4 | No | 1 (No Spreading) | 1 | 200 |

The symbol interleaving unit 9 of the interleaving circuit 2-3 as shown in FIG. 6 receives the input bitstream of encoded bits from the error correction encoder 2-2 and permutes adjacent bits of this input bitstream across different OFDM symbols. By permuting the bits across different OFDM symbols the frequency diversity across different subfrequency bands $f_a$, $f_b$, $f_c$ is exploited to increase the performance of the date transmission. Additionally time diversity is achieved increasing the performance under temporal noises such as simultaneously operating networks with different TFC.

Figure 7:
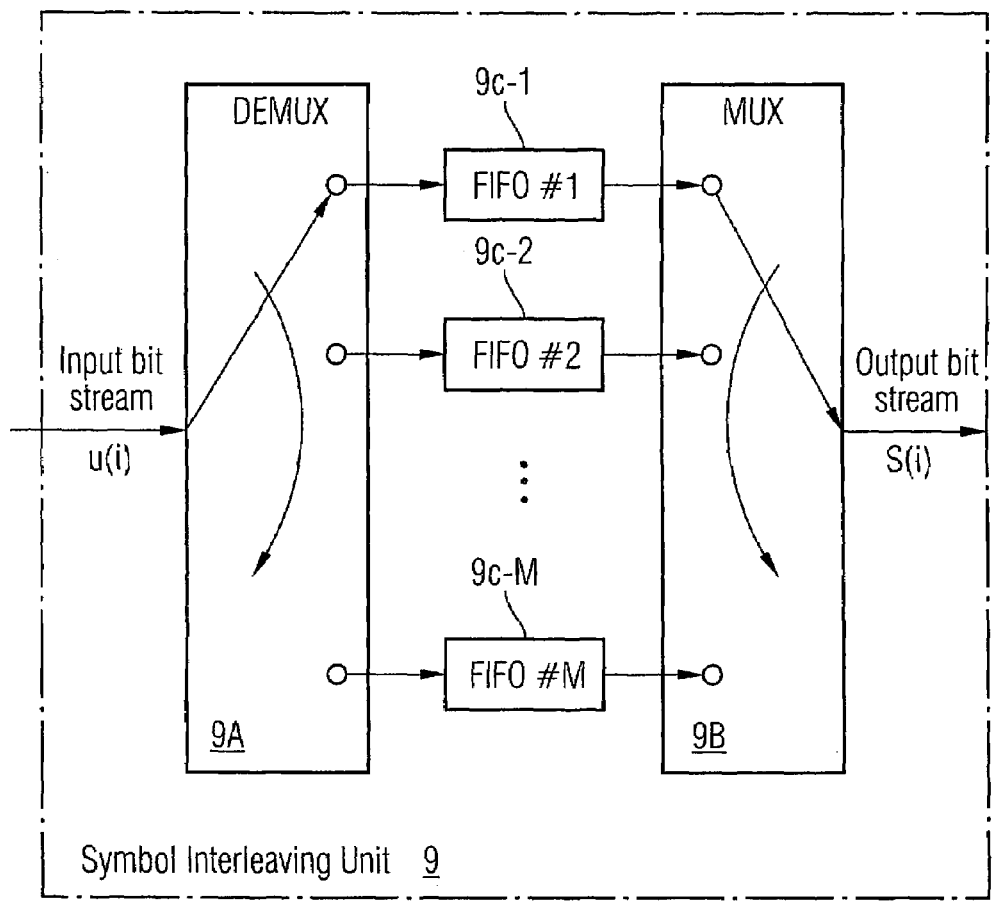
FIG. 7 shows a block diagram of a preferred embodiment of a symbol interleaving unit within an interleaving circuit according to the present invention.

FIG. 7 shows a preferred embodiment of the symbol interleaving unit 9 within the interleaving circuit 2-3 according to the present invention as shown in FIG. 6. The symbol interleaving unit 9 comprises a demultiplexer 9A and a multiplexer 9B wherein between each output of the demultiplexer 9A and each input of the multiplexer 9B the memory 9C-i is provided. The number of memories 9C-i provided within the symbol interleaving unit 9 corresponds to the least common multiple of the set of frequency hopping pattern periodicities $P_{max}$. In the example as shown in FIG. 3b the least common multiple of the set of frequency hopping pattern periodicities $P_{max}$ is six because at least every sixth OFDM symbol is transmitted within the same frequency band $f_i$.

The number of FIFO symbols provided between the demultiplexer 9A and the multiplexer 9B is given by $P_{max}$, i.e. the least common multiple of the set of frequency hopping pattern periodicities. Out of the $P_{max}$ memories M are used, where M is given by $P_{max}/TSF$, i.e. the least common multiple of the set of frequency hopping pattern periodicities divided by the time spreading factor used by the time spreading unit 2-6. The selection of M is based on the data rate. Specifically for a least common multiple of the periodicities of six OFDM symbols ($P_{max}=6$) M is selected to be six if no time spreading it performed (TSF=1) and selected to be three if time spreading is employed (TSF=2). For every bit received by the demultiplexer 9A the demultiplexer switches to the next output so that each bit is stored in the next memory $9c_{i+1}$. The memories $9c_i$ are formed in a preferred embodiment by FIFO registers each having a storage capacity of $N_{CBPS}$ bits, Every $N_{CBPS}$ bits the multiplexer 9B switches to the next input so that a block of $N_{CBPS}$ is pulled from each FIFO register 9c-i. The symbol interleaving unit 9 outputs a bitstream consisting of blocks each having $N_{CBPS}$ bits. In an alternative embodiment the memories 9c-i are implemented by simple memories and a corresponding addressing unit. $N_{CBPS}$ is the number of coded bits per OFDM symbol.

In a preferred embodiment each memory 9c-i comprises a storage capacity of at least the maximal $N_{CBPS}$ bits, i.e. 200 bits in a preferred embodiment. The symbol interleaving unit 9 interleaves among $M*N_{CBPS}=(P_{max}/TSF)*N_{CBPS}$ coded bits. The selection of $N_{CBPS}$ depends on the selected data rate, wherein $N_{CBPS}=100$ when frequency spreading is activated and wherein $N_{CBPS}=200$ when no frequency spreading is performed.

The encoded bits are first grouped together into blocks of $M*N_{CBPS}$ coded bits corresponding to $M*TSF$ OFDM symbols transmitted over the air. Each group of coded bits is sent permuted using a block interleaver of the size $M*N_{CBPS}$.

The input data sequence U(i) applied to the symbol interleaving unit 9 leads to the output bit sequence S(i) output by said symbol interleaving unit 9.

The input-output relation ship of the symbol interleaving unit 9 is given by:

$$S(i)=U\{Floor(i/N_{CBPS})+M\,Mod(i, N_{CBPS})\} \quad (1)$$

wherein $M=P_{max}/TSF$ wherein the function Floor( ) returns the largest integer value less than or equal to its argument value and wherein the function Mod( ) returns the remainder after division of i by $N_{CBPS}$. If the number of coded bits available at the input of the symbol block interleaving unit 9 corresponds to less than $M*N_{CBPS}$ coded bits the output of the encoder is pad out to $M*N_{CBPS}$ bits.

The output of the symbol interleaving unit 9 is passed to a tone interleaving unit 10 of the interleaving circuit 2-3 as shown in FIG. 6.

Figure 8:
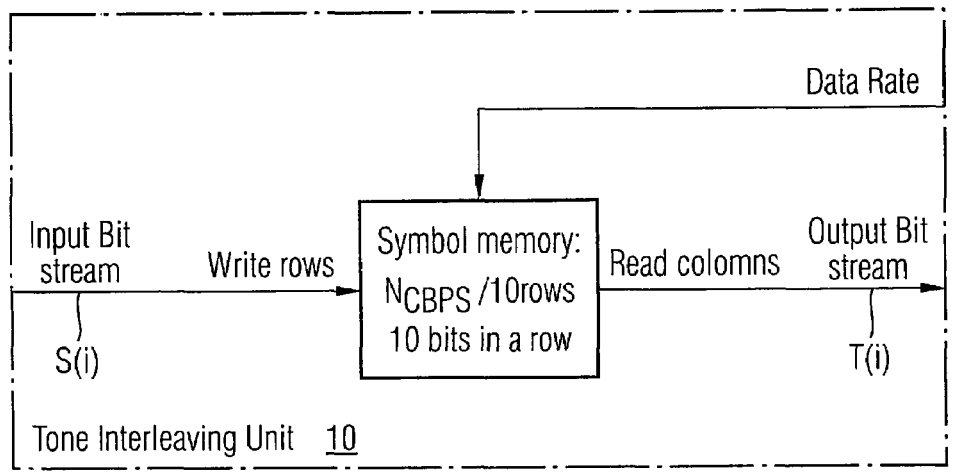
FIG. 8 shows a block diagram of a preferred embodiment of a tone interleaving unit within an interleaving circuit according to the present invention.

FIG. 8 shows a preferred embodiment of the tone interleaving unit 10 according to the present invention. The output bitstream of the symbol interleaving unit 9 are grouped together into blocks of $N_{CBPS}$ bits and then permuted using a regular block interleaver of the memory size $N_{TINT}*10$ wherein $N_{TINT}=N_{CBPS}/10$.

The tone interleaving unit 10 receives the output bitstream S(i) from the symbol interleaving unit 9 and outputs an output bitstream T(i) to the cyclic shift unit 11.

The input-output relationship between the output bitstream T(i) output by the tone interleaving unit 10 and the input bitstream S(i) applied to the tone interleaving unit 10 is given by:

$$T(i)=S\{Floor(i/N_{TINT})+10Mod(i, N_{TINT})\} \quad (2)$$

wherein $N_{TINT}=N_{CBPS}/10$ wherein the function Mod( ) returns the remainder after division of i by $N_{TINT}$ and wherein $i=0, 1, \ldots, N_{CBPS-1}$.

The number $N_{CBPS}$ depends on the selected data rate, wherein $N_{CBPS}=100$ when frequency spreading is activated and wherein $N_{CBPS}=200$ when no frequency spreading is performed.

The output bitstream T(i) of the tone interleaving unit 10 is applied to a third stage of the interleaving circuit 2-3, i.e. the cyclic shift unit 11 as shown in FIG. 6.

Figure 9:
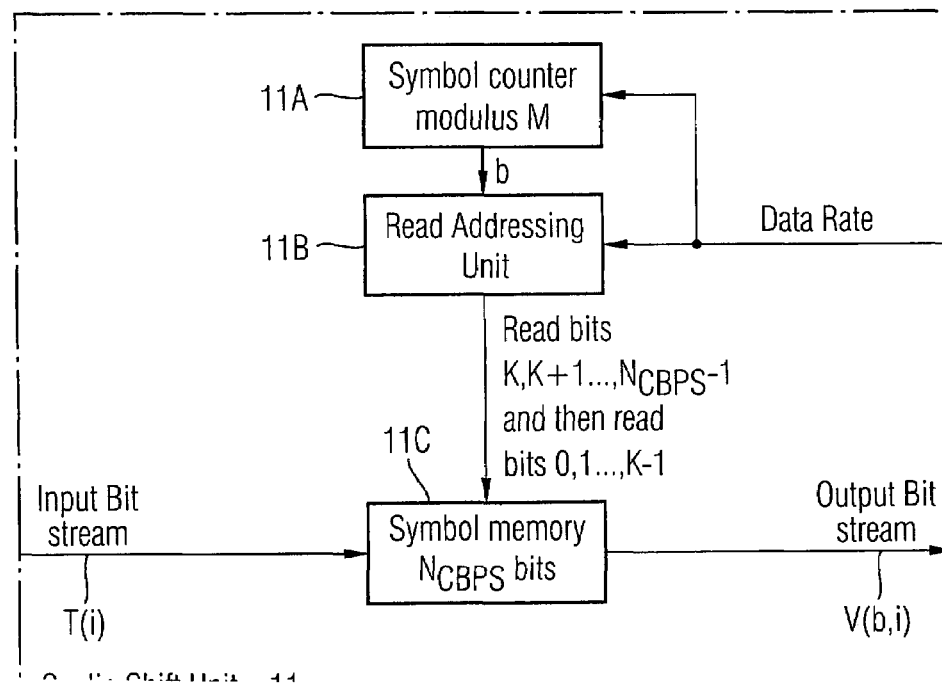
FIG. 9 shows a block diagram of a preferred embodiment of a cyclic shift unit within an interleaving circuit according to the present invention.

FIG. 9 shows a preferred embodiment of the cyclic shift unit 11 forming the third stage of the interleaving circuit 2-3 according to the present invention. The cyclic shift unit 11 comprises a symbol counter 11a which increments a counter modulus M every $N_{CBPS}$ bits. The output of the modulus M symbol counter 11a is an OFDM symbol index b which is applied to a read addressing unit 11b of the cyclic shift unit 11. The OFDM symbol index b has values between 0, 1, 2, . . . and . . . M−1. The read addressing unit 11b addresses a symbol memory 11c within the cyclic shift unit 11.

For every group of $N_{CBPS}$ bits, i.e. every OFDM symbol, the addressing unit 11b reads $N_{CBPS}$ bits starting with the last $N_{CBPS}-K$ bits and then outputting the first K bits, wherein K is a shift value depending from the OFDM symbol index b.

When the cyclic shift unit 11 receives the first OFDM symbol it performs a cyclical shift of 0*K. Then the cyclic shift unit 11 takes the second OFDM symbol and shifts it by 1*K bits. In the next step the cyclic shift unit 11 reads in the third OFDM symbol and shifts it by 2*K and so on. Finally the cyclic shift unit 11 reads in the M-Ch OFDM symbol and shifts it by (M−1)*K bits In a first embodiment the cyclic shift unit 11 shifts the bits to the right. In an alternative embodiment of the cyclic shift unit 11 shifts the bits to the left.

The input-output relationship between the output bits V(i) output by said cyclic shift unit 11 and the input bits T(i) applied to the cyclic shift unit 11 is given by:

$$V(i)=T\{b, Mod(i+k(b), N_{CBPS})\} \quad (3)$$

wherein K is a shift value depending from the OFDM symbol index b generated by the symbol counter in 11A.

The shift value K employed by the cyclical shift unit 11 is given in a first mode of the OFDM transceiver by:

$$k(b)=b \cdot round(N_{CBPS}/M) \quad (4)$$

wherein
b is the OFDM symbol index b
b=0, 1, 2, . . . , M−1
and
$M=P_{max}/TSF$ wherein b constitutes the OFDM symbol index and is 0, 1, 2, . . . , M−1.

The number M is given by: $M=P_{max}/TSF$ wherein $P_{max}$ is the least common multiple of the set of frequency hopping pattern periodicities and TSF is the time spreading factor employed by the time spreading unit 2-6 in corresponding to the selected data rate.

The above selection of the shift value K makes sure that adjacent bits in the coded bitstream are 1/M frequency band away from each other when no frequency conjugate symmetry is applied. Some operation modes or data rates involve frequency domain spreading which is achieved by using conjugate symmetry in the frequency domain within the OFDM symbol. The cyclic shift interleaving performed by the cyclic shift unit 11 makes sure that adjacent bits in the coded bitstream are a 1/M frequency band away from each other when there is no frequency spreading and 1/(2M) frequency bands away in case that frequency spreading is applied.

The bit interleaving circuit 2-3 according to the present invention comprising three stages makes sure that adjacent bits in the encoded bitstreams are loaded on different tones in adjacent OFDM symbols The performance advantage of the bit interleaving circuit 2-3 shows up specifically when simultaneous operating networks are located close to each other. In such a situation some of the OFDM symbols collide and the advantage of the bit interleaving circuit according to the present invention for the remaining OFDM symbol is substantial, in particular since the redundancy introduced by time spreading is lost.

Time spreading requires a reduced IFFT rate by the modulator. This enables reduced power consumption of the transceiver or even reduced silicon size when high throughput modes that do not involve time spreading are not used. Improved performance achieved by the bit interleaving circuit according to the present invention is achieved while maintaining the same reduced IFFT operation rate when time spreading is applied thus maintaining the low power consumption.

Figure 11:
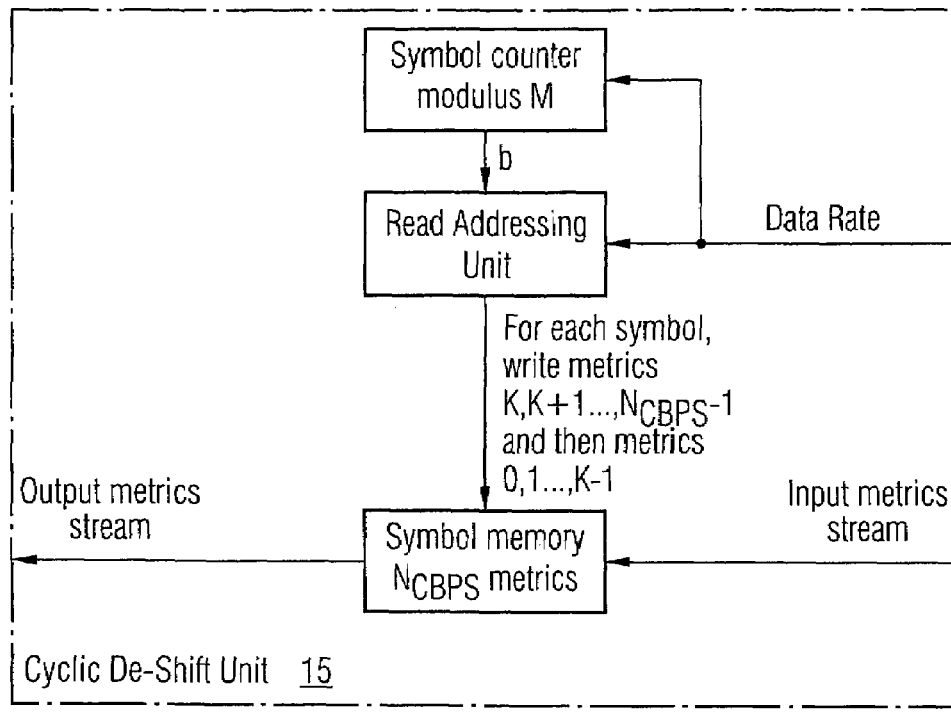
FIG. 11 shows a block diagram of a cyclic de-shift unit provided in a deinterleaving circuit as shown in FIG. 10.
Figure 12:
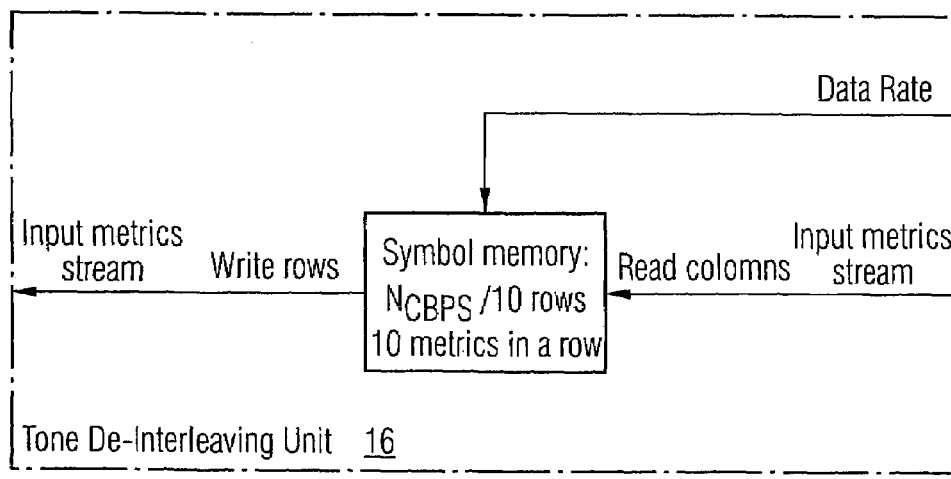
FIG. 12 shows a block diagram of a preferred embodiment of a tone deinterleaving unit provided in a deinterleaving circuit as shown in FIG. 10.
Figure 13:
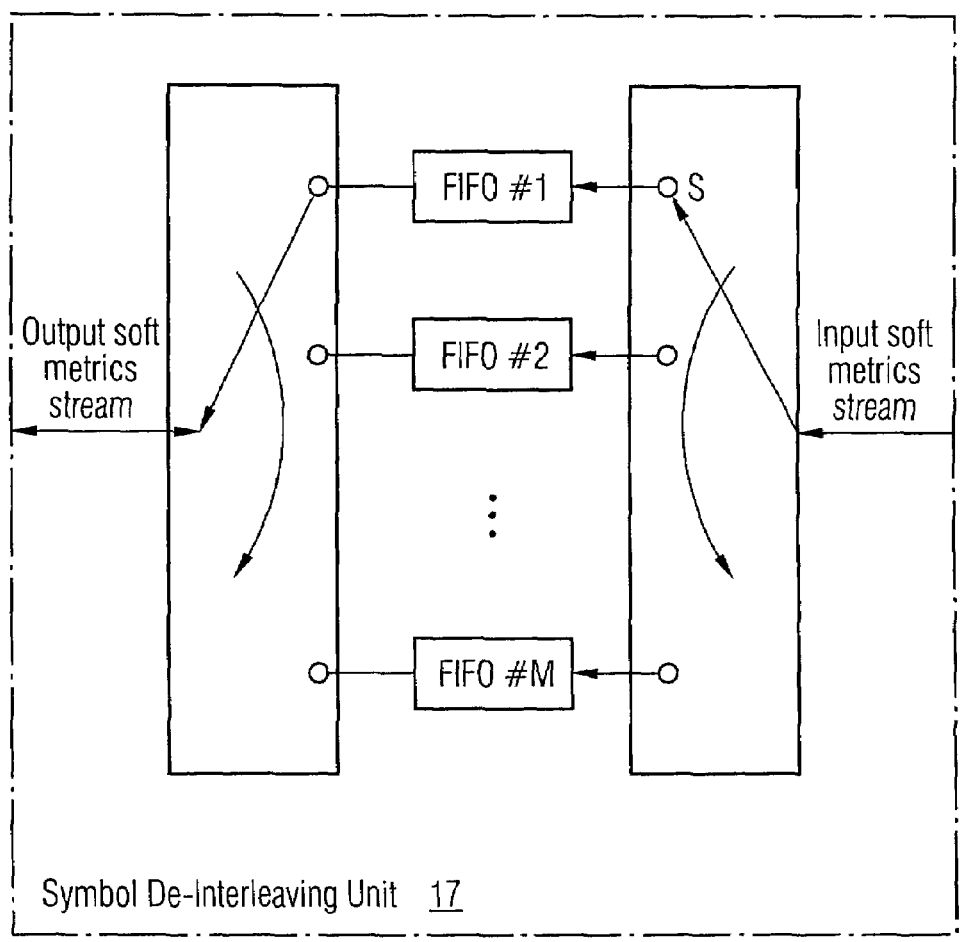
FIG. 13 shows a block diagram of a symbol deinterleaving unit provided within a deinterleaving circuit as shown in FIG. 10.

The OFDM transceiver 1 as shown in FIG. 5 comprises on its receiving side a deinterleaving circuit 3-5 which is formed symmetrically to the interleaving circuit 2-3 according to the present invention. The De-Interleaving circuit 3-5 comprises also three stages, i.e. a cyclic deshift unit 15, a tone deinterleaving unit 16 and a symbol deinterleaving unit 17 connected in series. A preferred embodiment of cyclic the deshifting unit 15 is shown in FIG. 11. FIG. 12 shows a preferred embodiment of the tone deinterleaving unit 16 and FIG. 13 shows a preferred embodiment of the symbol deinterleaving unit 17.

The deinterleaving circuit 3-5 is a mirror block to the interleaving circuit 2-3 on the transmitting side of the transceiver 1. The main difference is that instead of the bitstream interleaving the deinterleaving is applied on non-binary numbers. Each number is a soft description of a received bit and is called a metric The resolution of the metrics is typically higher than one and therefore not binary. Different resolutions can be chosen for different embodiments. The resolution selection is a trade-off between silicon size and power consumption on one side and performance on the other side In a preferred embodiment the resolution of the metrics is 4 to 5 bits.

The invention claimed is:

1. Interleaving circuit for a multiband OFDM (orthogonal frequency division multiplexing) transceiver of an ultra wide band wireless personal access network transmitting OFDM modulated symbols, wherein each OFDM symbol consists of a predetermined number ($N_{CBPS}$) of encoded bits, said interleaving circuit comprising:
   (a) a symbol interleaving unit which receives an input bitstream of encoded bits and permutes adjacent bits of said input bitstream across different OFDM symbols;
   (b) an intra-symbol tone interleaving unit which receives the bits permuted by said symbol interleaving unit and permutes adjacent bits of each OFDM symbol across uncorrelated data sub-carriers;
   (c) an intra-symbol cyclic shift unit which shifts cyclically $N_{CBPS}$ bits of each OFDM symbol depending on a shift value (K) which is changed between adjacent OFDM symbols;
   wherein each OFDM symbol is forwarded by said interleaving circuit to a frequency spreading unit which depending on data rate spreads the OFDM symbols in the frequency domain with an adjustable frequency spreading factor (FSF);
   wherein the frequency spreading unit is connected to an OFDM modulator which performs for each sub-carrier of the frequency band depending on the data rate either a DCM modulation or a QPSK modulation;
   wherein the OFDM modulator is connected to a time spreading unit which depending on an operation mode of said OFDM transceiver spreads the OFDM symbols in the time domain with a time spreading factor (TSF);
   wherein the time spreading unit is connected to a transmitter which transmits each interleaved OFDM symbol in different frequency bands according to a predetermined frequency hopping pattern comprising a corresponding pattern periodicity (P);
   wherein the least common multiple of the set of frequency hopping pattern periodicities ($P_{max}$) is six.

2. The interleaving circuit according to claim 1 wherein the number of frequency bands is three.

3. The interleaving circuit according to claim 1 wherein each frequency band comprises a center frequency and a predetermined number of sub-carriers.

4. The interleaving circuit according to claim 3 wherein the sub-carriers of each frequency band comprises pilot sub-carriers, guard sub-carriers and data sub-carriers.

5. The interleaving circuit according to claim 3 wherein the number of sub-carriers within each frequency band is 122.

6. The interleaving circuit according to claim 4 wherein the number of data sub-carriers within each frequency band is 100.

7. The interleaving circuit according to claim 1 wherein the input-output relationship between the output bits S(i) output by said symbol interleaving unit and the input bits U(i) applied to the symbol interleaving unit is given by $$S(i)=U\{\text{Floor}(i/N_{CPPS})+M \text{ Mod}(i, N_{CBPS})\} \qquad (1)$$

wherein $M=P_{max}/TSF$

8. The interleaving circuit according to claim 1 wherein the input-output relationship between the output bits T(i) output by said tone interleaving unit and the input bits S(i) applied to the tone interleaving unit is given by:

$$T(i)=S\{\text{Floor}(i/N_{TINT})+10\text{Mod}(i, N_{TINT})\} \qquad (2)$$

wherein $N_{TINT}=N_{CBPS}/10$

9. The interleaving circuit according to claim 1 wherein the input-output relationship between the output bits V(i) output by said cyclic shift unit and the input bits T(i) applied to said cyclic shift unit is given by:

$$V(i)=T\{b, \text{Mod}(i+k(b), N_{CBPS})\} \qquad (3)$$

wherein K is the shift value depending from an OFDM symbol index b.

10. The interleaving circuit according to claim 9 wherein the shift value K employed by the cyclic shift unit is given by:

$$k(b)=b \cdot \text{round}(N_{CBPS}/M) \qquad (4)$$

wherein b is an OFDM symbol index with b=0, 1, 2, . . . , M−1 and $M=P_{max}.TSF$ wherein $P_{max}$ is the least common multiple of the set of frequency hopping pattern periodicities and TSF is the time spreading factor of the time spreading unit, wherein $$k(b) = \begin{cases} 0 & \text{for } b = 0, 1, 2 \\ \text{round}(N_{CBPS}/M) & \text{for } b = 3 \\ 2 \cdot \text{round}(N_{CBPS}/M) & \text{for } b = 4, 5, 6 \end{cases} \quad (5)$$

wherein $b$ is an OFDM symbol index and $M = P_{\max}/TSF$.

11. Method for interleaving encoded bits within a multi band OFDM (orthogonal frequency division multiplexing) transceiver of a ultra wide band wireless personal access network transmitting OFDM modulated symbols, wherein the method comprises the following steps:
   (a) receiving an input bitstream of encoded bits and permuting adjacent bits of said input bitstream across different OFDM symbols;
   (b) permuting further adjacent bits of each OFDM symbol across uncorrelated data sub-carriers;
   (c) shifting cyclically $N_{CBPS}$ bits of each OFDM symbol depending on a shift value (K) which is changed between adjacent OFDM symbols;
   wherein each OFDM symbol is forwarded by said interleaving circuit to a frequency spreading unit which depending on data rate spreads the OFDM symbols in the frequency domain with an adjustable frequency spreading factor (FSF);
   wherein the frequency spreading unit is connected to an OFDM modulator which performs for each sub-carrier of the frequency band depending on the data rate either a DCM modulation or a QPSK modulation;
   wherein the OFDM modulator is connected to a time spreading unit which depending on an operation mode of said OFDM transceiver spreads the OFDM symbols in the time domain with a time spreading factor (TSF);
   wherein the time spreading unit is connected to a transmitter which transmits each interleaved OFDM symbol in different frequency bands according to a predetermined frequency hopping pattern comprising a corresponding pattern periodicity (P); and
   wherein the least common multiple of the set of frequency hopping pattern periodicities ($P_{max}$) is six.

12. Interleaving circuit for a multiband OFDM (orthogonal frequency division multiplexing) transceiver of an ultra wide band wireless personal access network transmitting OFDM modulated symbols, wherein each OFDM symbol consists of a predetermined number ($N_{CBPS}$) of encoded bits, said interleaving circuit comprising:
   (a) a symbol interleaving unit which receives an input bitstream of encoded bits and permutes adjacent bits of said input bitstream across different OFDM symbols;
   (b) an intra-symbol tone interleaving unit which receives the bits permuted by said symbol interleaving unit and permutes adjacent bits of each OFDM symbol across uncorrelated data sub-carriers;
   (c) an intra-symbol cyclic shift unit which shifts cyclically $N_{CBPS}$ bits of each OFDM symbol depending on a shift value (K) which is changed between adjacent OFDM symbols;
   wherein each OFDM symbol is forwarded by said interleaving circuit to a frequency spreading unit which depending on data rate spreads the OFDM symbols in the frequency domain with an adjustable frequency spreading factor (FSF);
   wherein the frequency spreading unit is connected to an OFDM modulator which performs for each sub-carrier of the frequency band depending on the data rate either a DCM modulation or a QPSK modulation;
   wherein the OFDM modulator is connected to a time spreading unit which depending on an operation mode of said OFDM transceiver spreads the OFDM symbols in the time domain with a time spreading factor (TSF);
   wherein the time spreading unit is connected to a transmitter which transmits each interleaved OFDM symbol in different frequency bands according to a predetermined frequency hopping pattern comprising a corresponding pattern periodicity (P);
   wherein each frequency band comprises a center frequency and a predetermined number of sub-carriers;
   wherein the number of sub-carriers within each frequency band is 122 or the number of data sub-carriers within each frequency band is 100.

13. Interleaving circuit for a multiband OFDM (orthogonal frequency division multiplexing) transceiver of an ultra wide band wireless personal access network transmitting OFDM modulated symbols, wherein each OFDM symbol consists of a predetermined number ($N_{CBPS}$) of encoded bits, said interleaving circuit comprising:
   (a) a symbol interleaving unit which receives an input bitstream of encoded bits and permutes adjacent bits of said input bitstream across different OFDM symbols;
   (b) an intra-symbol tone interleaving unit which receives the bits permuted by said symbol interleaving unit and permutes adjacent bits of each OFDM symbol across uncorrelated data sub-carriers;
   (c) an intra-symbol cyclic shift unit which shifts cyclically $N_{CBPS}$ bits of each OFDM symbol depending on a shift value (K) which is changed between adjacent OFDM symbols;
   wherein the input-output relationship between the output bits S(i) output by said symbol interleaving unit and the input bits U(i) applied to the symbol interleaving unit is given by $$S(i) = U\{\text{Floor}(i/N_{CPPS}) + M \text{ Mod}(i, N_{CBPS})\} \quad (6)$$

wherein $M = P_{max}/TSF$

14. Interleaving circuit for a multiband OFDM (orthogonal frequency division multiplexing) transceiver of an ultra wide band wireless personal access network transmitting OFDM modulated symbols, wherein each OFDM symbol consists of a predetermined number ($N_{CBPS}$) of encoded bits, said interleaving circuit comprising:
   (a) a symbol interleaving unit which receives an input bitstream of encoded bits and permutes adjacent bits of said input bitstream across different OFDM symbols;
   (b) an intra-symbol tone interleaving unit which receives the bits permuted by said symbol interleaving unit and permutes adjacent bits of each OFDM symbol across uncorrelated data sub-carriers;
   (c) an intra-symbol cyclic shift unit which shifts cyclically $N_{CBPS}$ bits of each OFDM symbol depending on a shift value (K) which is changed between adjacent OFDM symbols;
   wherein the input-output relationship between the output bits T(i) output by said tone interleaving unit and the input bits S(i) applied to the tone interleaving unit is given by $$T(i)=S\{\text{Floor}(i/N_{TINT})+10\text{Mod}(i, N_{TINT})\} \quad (7)$$

wherein $N_{TINT}=N_{CBPS}/10$

15. Interleaving circuit for a multiband OFDM (orthogonal frequency division multiplexing) transceiver of an ultra wide band wireless personal access network transmitting OFDM modulated symbols, wherein each OFDM symbol consists of a predetermined number ($N_{CBPS}$) of encoded bits, said interleaving circuit comprising:
- (a) a symbol interleaving unit which receives an input bitstream of encoded bits and permutes adjacent bits of said input bitstream across different OFDM symbols;
- (b) an intra-symbol tone interleaving unit which receives the bits permuted by said symbol interleaving unit and permutes adjacent bits of each OFDM symbol across uncorrelated data sub-carriers;
- (c) an intra-symbol cyclic shift unit which shifts cyclically $N_{CBPS}$ bits of each OFDM symbol depending on a shift value (K) which is changed between adjacent OFDM symbols;

wherein the input-output relationship between the output bits V(i) output by said cyclic shift unit and the input bits T(i) applied to said cyclic shift unit is given by:

$$V(i)=T\{b, \text{Mod}(i+k(b), N_{CBPS})\} \quad (8)$$

16. The interleaving circuit according to claim 15 wherein the shift value K employed by the cyclic shift unit is given by:

$$k(b)=b \cdot \text{round}(N_{CBPS}/M) \quad (9)$$

wherein b is an OFDM symbol index with b=0, 1, 2, . . . , M−1 and

M=$P_{max}$;TSF wherein $P_{max}$ is the least common multiple of the set of frequency hopping pattern periodicities and TSF is the time spreading factor of the time spreading unit, wherein $$k(b) = \begin{cases} 0 & \text{for } b = 0, 1, 2 \\ round(N_{CBPS}/M) & \text{for } b = 3 \\ 2 \cdot round(N_{CBPS}/M) & \text{for } b = 4, 5, 6 \end{cases}$$

wherein $b$ is an *OFDM* symbol index and $M = P_{max}/TSF$

* * * * *